(12) United States Patent
Matyushkin et al.

(10) Patent No.: US 12,340,989 B2
(45) Date of Patent: Jun. 24, 2025

(54) ELECTROSTATIC EDGE RING MOUNTING SYSTEM FOR SUBSTRATE PROCESSING

(71) Applicant: LAM RESEARCH CORPORATION, Fremont, CA (US)

(72) Inventors: Alexander Matyushkin, San Jose, CA (US); Keith Comendant, Fremont, CA (US); Adam Christopher Mace, Morgan Hill, CA (US); Darrell Ehrlich, San Jose, CA (US); John Holland, San Jose, CA (US); Felix Leib Kozakevich, Sunnyvale, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 222 days.

(21) Appl. No.: 17/796,740

(22) PCT Filed: Feb. 3, 2021

(86) PCT No.: PCT/US2021/016340
§ 371 (c)(1),
(2) Date: Aug. 1, 2022

(87) PCT Pub. No.: WO2021/158612
PCT Pub. Date: Aug. 12, 2021

(65) Prior Publication Data
US 2023/0075462 A1 Mar. 9, 2023

Related U.S. Application Data

(60) Provisional application No. 62/969,933, filed on Feb. 4, 2020.

(51) Int. Cl.
*H01J 37/32* (2006.01)
*H01L 21/687* (2006.01)

(52) U.S. Cl.
CPC .... *H01J 37/32642* (2013.01); *H01J 37/3244* (2013.01); *H01J 37/32532* (2013.01); *H01J 37/32715* (2013.01); *H01L 21/68721* (2013.01)

(58) Field of Classification Search
CPC ............. H01J 37/32715; H01J 37/3244; H01J 37/32642; H01J 37/32532;
(Continued)

(56) References Cited

U.S. PATENT DOCUMENTS 6,475,336 B1 11/2002 Hubacek
9,922,857 B1 3/2018 Kimball et al.
(Continued)

FOREIGN PATENT DOCUMENTS

JP 2008244274 A 10/2008
JP 2014222786 A 11/2014
(Continued)

OTHER PUBLICATIONS

International Search Report and Written Opinion of the ISA issued in PCT/US2021/016340, mailed May 31, 2021; ISA/KR.
(Continued)

*Primary Examiner* — Thai Pham (57) ABSTRACT

An edge ring system comprising a substrate support configured to support a substrate during plasma processing and including a baseplate and an upper layer arranged on the baseplate. An edge ring support includes a first body and an electrostatic clamping electrode arranged in the first body. The edge ring support is arranged above the baseplate and radially outside of the substrate during processing. An edge ring includes a second body arranged on and electrostatically clamped to the edge ring support during plasma processing.

25 Claims, 9 Drawing Sheets

(58) Field of Classification Search
CPC ...... H01J 2237/0262; H01J 2229/4831; H01L 21/687; H01L 21/68721; H01L 21/68735; H01L 21/683; H01L 21/6831
See application file for complete search history.

(56) References Cited

U.S. PATENT DOCUMENTS

| | | | |
|---|---|---|---|
| 11,848,177 B2* | 12/2023 | Wang | H01L 21/67248 |
| 2005/0133164 A1 | 6/2005 | Fischer et al. | |
| 2010/0040768 A1 | 2/2010 | Dhindsa | |
| 2013/0008609 A1 | 1/2013 | Koshimizu et al. | |
| 2014/0034243 A1* | 2/2014 | Dhindsa | H01J 37/21 |
| | | | 156/345.51 |
| 2017/0330734 A1 | 11/2017 | Lee et al. | |
| 2018/0025891 A1* | 1/2018 | Marakhtanov | H01J 37/32568 |
| | | | 438/714 |
| 2018/0166312 A1* | 6/2018 | Kimball | H01L 21/6831 |
| 2019/0057839 A1 | 2/2019 | Kellogg et al. | |
| 2020/0066495 A1* | 2/2020 | Noorbakhsh | H01J 37/32541 |
| 2022/0328290 A1* | 10/2022 | Mishra | H01J 37/32385 |

FOREIGN PATENT DOCUMENTS

| | | |
|---|---|---|
| JP | 2018086331 A | 6/2018 |
| KR | 1020170127724 A | 11/2017 |
| WO | WO-2017101738 A1 | 6/2017 |
| WO | WO-2019103722 A1 | 2/2018 |
| WO | WO-2019143473 A1 | 7/2019 |

OTHER PUBLICATIONS

Aaron Eppler, "Controlling Uniformity at the Edge", Semiconductor Engineering, Oct. 19, 2017 (https://semiengineering.com/controlling-uniformity-at-the-edge).

Japanese Office Action from corresponding Application No. 2022-547226, dated Oct. 1, 2024.

Taiwanese Office Action from corresponding Application No. 110103991 dated, Nov. 5, 2024.

* cited by examiner

ELECTROSTATIC EDGE RING MOUNTING SYSTEM FOR SUBSTRATE PROCESSING

CROSS-REFERENCE TO RELATED APPLICATIONS

This application is a U.S. National Phase Application under 35 U.S.C. 371 of International Application No. PCT/US2021/016340, filed on Feb. 3, 2021, which claims the benefit of U.S. Provisional Application No. 62/969,933, filed on Feb. 4, 2020. The entire disclosures of the applications referenced above are incorporated herein by reference.

FIELD

The present disclosure relates to substrate processing systems and more particularly to an edge ring mounting system for a substrate support of a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

The substrate support typically includes an upper layer made of ceramic that is bonded to a baseplate. An edge ring is typically supported on the baseplate or another structure and is located radially outside of a substrate during processing. The edge ring is used to alter the effect of the plasma on the substrate.

For older technology nodes, etch rate and/or tilt uniformity of the substrate can be controlled and/or adjusted using edge rings having different shapes and/or locations relative to the substrate. Additional tuning can be performed by adjusting and controlling RF voltage coupling impedance between the edge ring and the substrate support. However, newer technology nodes require more accurate edge tilt tuning.

Edge tilt uniformity may be improved using a thermal interface material (TIM) located under the edge ring. The TIM provides adequate thermal performance/edge ring temperature under high plasma loads. However, the TIM needs to be replaced every time the processing chamber is cleaned. However, it is cumbersome to remove and replace the TIM, which causes relatively long chamber open-to-close periods and reduces customer satisfaction.

SUMMARY

An edge ring system includes a substrate support configured to support a substrate during plasma processing. The edge ring system includes a baseplate and an upper layer arranged on the baseplate. An edge ring support includes a first body and an electrostatic clamping electrode arranged in the first body. The edge ring support is arranged above the baseplate and radially outside of the substrate during processing. An edge ring includes a second body arranged on and electrostatically clamped to the edge ring support during plasma processing. The edge ring is arranged between the edge ring support and plasma generated during plasma processing.

In other features, a supply conductor is configured to supply power to the electrostatic clamping electrode. A gas supply line is configured to supply gas between the edge ring and the edge ring support. The supply conductor and the gas supply line pass through the baseplate.

In other features, a gas supply line supplies gas to a cavity defined by at least one of the edge ring support and the edge ring between the edge ring support and the edge ring. The second body of the edge ring support further includes the cavity on an upper surface of the edge ring support facing the edge ring. The first body of the edge ring further includes the cavity on a lower surface of the edge ring facing the edge ring support. The gas supply line passes through a portion of the baseplate.

In other features, a first outer edge ring is arranged radially outside of the edge ring and the edge ring support. A first seal is arranged between an inner surface of the first outer edge ring and an outer surface of the baseplate.

In other features, a second outer edge ring is arranged radially outside of the first outer edge ring. A second seal is arranged between an inner surface of the second outer edge ring and an outer surface of the first outer edge ring. The edge ring support is bonded to an upper surface of the baseplate. Thermal interface material is arranged between the edge ring support and an upper surface of the baseplate. The edge ring is not bonded to the edge ring support.

In other features, the second body of the edge ring includes a projection on a lower and radially inner surface thereof. The projection extends radially inside of a radially outer surface of the substrate. An annular ring is arranged below the edge ring and radially outside of the edge ring support. The annular ring includes a third body and an electrode arranged in the third body.

In other features, a first outer edge ring is arranged radially outside of the edge ring and the edge ring support. A first seal is arranged between an inner surface of the first outer edge ring and the baseplate radially inside of the annular ring. An annular ring is arranged below the edge ring, radially outside of the edge ring support and radially inside of the first outer edge ring. The annular ring includes a third body and an electrode arranged in the third body. A seal is arranged between annular ring and the first outer edge ring.

In other features, a first outer edge ring is arranged radially outside of the edge ring and the edge ring support. A supply conductor is configured to supply power to the electrostatic clamping electrode. A gas supply line is configured to supply gas between the edge ring and the edge ring support. At least one of the supply conductor and the gas supply line passes through the first outer edge ring.

In other features, the supply conductor and the gas supply line pass through the first outer edge ring and not through the baseplate. A first outer edge ring is arranged radially outside of the edge ring and the edge ring support. A threaded cavity is located in the edge ring support. A rod received in the threaded cavity is configured to mechanically clamp the edge ring support to the first outer edge ring.

In other features, an electrode is arranged in the edge ring support. A first supply conductor is configured to supply power to the electrostatic clamping electrode. A gas supply line is configured to supply gas between the edge ring and the edge ring support. A second supply conductor is configured to supply power to the electrode.

In other features, a first outer edge ring is arranged radially outside of the edge ring and the edge ring support. The first supply conductor and the gas supply line pass through the baseplate and the second supply conductor passes through the first outer edge ring.

In other features, a first outer edge ring is arranged radially outside of the edge ring and the edge ring support. A threaded cavity is located in the edge ring support. A rod is received in the threaded cavity configured to mechanically clamp the edge ring support to the first outer edge ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure may be used to improve edge tilt uniformity of substrate processing systems. In some examples, the substrate processing system generate capacitively-coupled RF plasma using an upper electrode and a lower electrode located in the process chamber. The substrate is arranged on a substrate support including the lower electrode. Plasma is generated between the substrate and the upper electrode. The substrate includes an edge ring that concentrically surrounds the lower electrode. In some examples, the edge ring includes an RF electrode for creating secondary plasma.

The substrate processing system includes one or more components to hold the edge ring in a way that ensures proper thermal conductance between the edge ring and the baseplate while allowing quick replacement of the edge ring during chamber cleaning. In some examples, the edge ring is held to components such as an edge ring support located below the edge ring using electrostatic clamping. In some examples, thermally conductive gas is supplied between the edge ring and components located below the edge ring to cool the edge ring. In some examples, the edge ring support is bonded or mechanically clamped to an outer edge ring. In some examples, seals are used to provide a vacuum break between a vacuum process in the processing chamber and a region below the substrate. In other processes, the seals may be omitted.

Figure 1A:
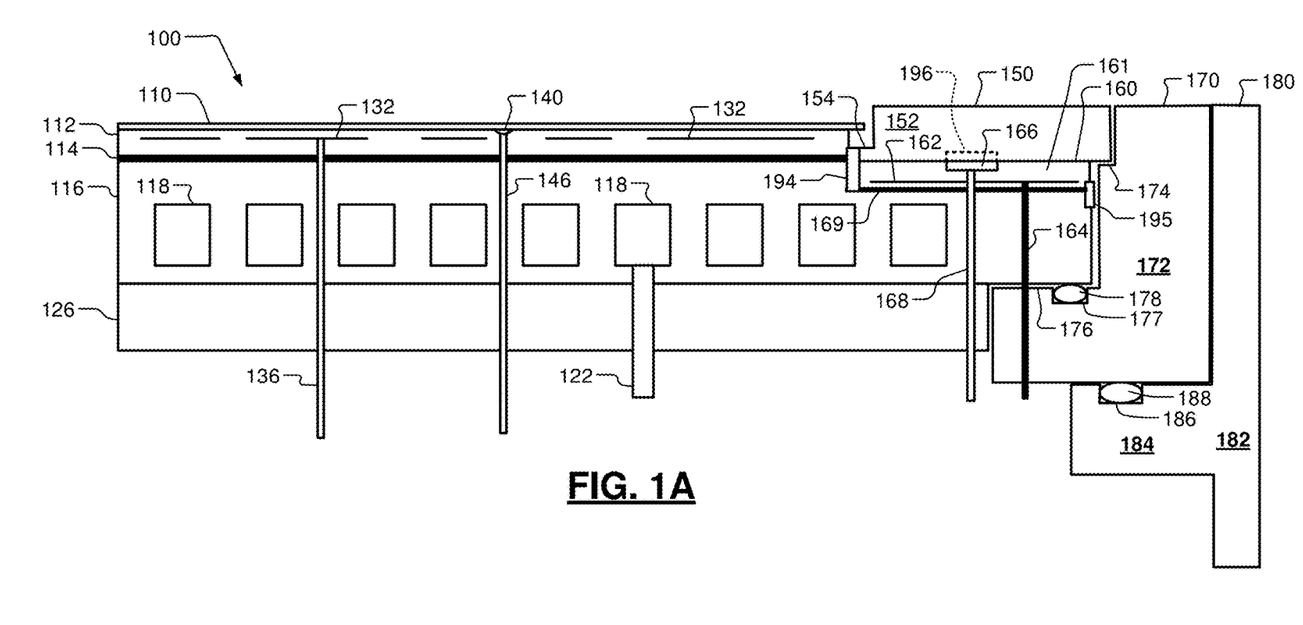
FIG. 1A is a cross-sectional side view of an example of a substrate support with an edge ring system according to the present disclosure.

Referring now to FIG. 1A, a portion of a substrate processing system including an edge ring is shown. A substrate support 100 supports a substrate 110 arranged on an upper surface of an upper layer 112 during processing. In some examples, the upper layer 112 is made of a material such as ceramic, although other materials can be used. The upper layer 112 is attached by a bonding layer 114 to a baseplate 116 arranged below the upper layer 112. The baseplate 116 includes a plurality of cooling channels 118. Fluid is supplied to the plurality of cooling channels 118 from a coolant supply conduit 122. In some examples, the baseplate 116 is attached to a lower plate 126, which may also be called a facilities plate.

A plurality of electrostatic clamping electrodes 132 are arranged in the upper layer 112. A clamping supply conductor 136 supplies voltage to the electrostatic clamping electrodes 132 when electrostatic clamping is needed. An upper surface of the upper layer 112 includes one or more gas channels 140 that are supplied by a gas supply line 146. For example, a thermally-conductive gas such as helium may be supplied to the gas channels 140 to increase heat transfer from the substrate to the upper layer 112 during processing. The gas channels 140 may define a gas channel pattern (not shown) on a substrate-facing surface of the upper layer 112 beneath the substrate 110.

An upper edge ring 150 includes an annular body 152. In some examples, the body 152 has a generally rectangular cross-section and includes an annular projection 154. In some examples, the upper edge ring 150 is made of a plasma resistant material such as silicon, silicon carbide, silicon oxide, ceramic, or another suitable material. In some examples, the annular projection 154 projects radially inwardly from an inner and lower surface of the annular body 152. In some examples, the annular projection 154 extends at least partially below a radially outer edge of the substrate 110.

Figure 1B:
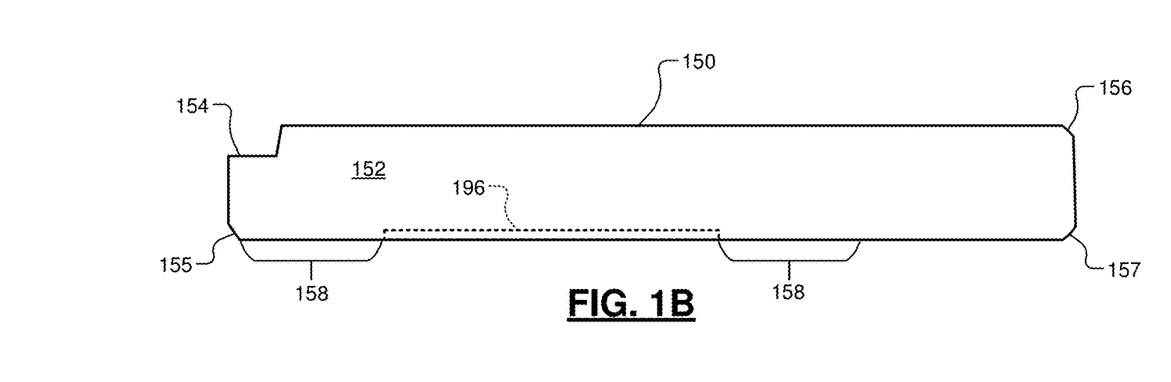
FIG. 1B shows an upper edge ring of FIG. 1A in more detail.

An example of the upper edge ring 150 is shown in more detail in FIG. 1B. As shown, one or more corners of the upper edge ring 150 may be rounded, chamfered, or partially rounded and partially chamfered. For example, one or more of a lower inner corner 155, an upper outer corner 156, and a lower outer corner 157 may be rounded or chamfered. A portion (e.g., a lower portion) of the lower inner corner 155 may be rounded while another portion (e.g., an upper portion) of the lower inner corner 155 may be chamfered.

The upper edge ring 150 rests on an edge ring support 160. The edge ring support 160 includes a body 161 and an electrostatic clamping electrode 162 arranged in the body 161. A clamping supply conductor 164 supplies power to the electrostatic clamping electrode 162 when electrostatic clamping of the upper edge ring 150 is desired. In some examples, a groove or cavity 166 is formed on the upper surface of the edge ring support 160 or a groove or cavity 196 (dotted lines) is formed on a bottom surface of the upper edge ring 150. The height or depth, width, and lateral position of the cavity 166/196 may be varied. A gas supply line 168 supplies gas to the cavity 166/196 during processing to increase heat transfer between the upper edge ring 150 and the edge ring support 160. The body 161 of the edge ring support 160 is bonded by a bonding layer 169 to an upper surface or shoulder of the baseplate 116.

Referring again to FIG. 1B, the cavity 196 may have a width, depth, and lateral position to optimize heat transfer. For example, a width and depth of the cavity 196 may determine volume and distribution of the heat transfer gas within the cavity 196. As the depth of the cavity 196 increases, heat transfer capability may decrease. Conversely, as the depth of the cavity 196 decreases and the width of the cavity 196 increases, the heat transfer capability increases. Accordingly, the depth of the cavity 196 may be less than one mil (i.e., 0.001 inches, or 0.0254 mm). In some examples, the depth of the cavity 196 is between 0.0001 and 0.0005 inches (i.e., between 0.00254 and 0.0127 mm). In this manner, the depth of the cavity 196 is relatively thin to facilitate heat transfer, and heat transfer capabilities are significantly reduced as the depth of the cavity 196 increases. For example, a depth of the cavity 196 greater than 10 mil may result in ineffective heat transfer.

The width of the cavity 196 may further be optimized to adjust both heat transfer capabilities and clamping effectiveness. As the width of the cavity 196 increases, widths of clamping regions 158 on either side of the cavity 196 decrease, which decreases clamping effectiveness. In other words, as the surface area of the regions 158 on either side of the cavity 196 decreases, the clamping effect provided by the clamping electrode 162 decreases. Conversely, as the width of the cavity 196 decreases, widths of the clamping regions 158 increases, which increases the clamping effectiveness. In this manner, the width of the cavity 196 can be adjusted to balance heat transfer and clamping effectiveness for a given edge ring assembly.

In one embodiment, the width of the cavity 196 (or a combination of widths of multiple cavities) is at least 25% of a width of the upper edge ring 150. In another embodiment, the width of the cavity 196 (or a combination of widths of multiple cavities) is at least 35% of the width of the upper edge ring 150. In another embodiment, the width of the cavity 196 (or a combination of widths of multiple cavities) is at least 40% of the width of the upper edge ring 150. In another embodiment, the width of the cavity 196 (or a combination of widths of multiple cavities) is at least 50% of the width of the upper edge ring 150.

A first outer edge ring 170 is arranged radially outside of baseplate 116, the upper edge ring 150 and the edge ring support 160. The first outer edge ring 170 includes a body 172 and first and second annular steps 174 and 176, respectively, projecting radially inwardly from the body 172. The first annular step 174 is at least partially arranged below a radially outer edge of the upper edge ring 150. The second annular step 176 is located at least partially below the first annular step 174. The second annular step 176 is also arranged at least partially below a radially outer edge of the baseplate 116 and/or the upper edge ring 150. An upper surface of the second annular step 176 includes an annular groove 177. In some examples, a seal 178 such as an O-ring is arranged in the annular groove 177. The clamping supply conductor 164 and/or the gas supply line 168 may pass through the baseplate 116, the first outer edge ring 170 and/or other components.

A second outer edge ring 180 includes an annular body 182 and an annular projection 184 projecting radially inwardly from a middle portion of the annular body 182. An upper surface of the annular projection 184 includes an annular groove 186. A seal 188 such as an O-ring is arranged in the annular groove 186.

A shaped seal 194 is arranged radially outside of the upper layer 112, the bonding layer 114 and the baseplate 116 and is used to protect the bonding layer 114 during processing. A shaped seal 195 is also arranged radially outside of the edge ring support 160 and the baseplate 116 and is used to protect the bonding layer 169. However, the shaped seals 194 and 195 do not provide a vacuum break.

In some examples, a first volume above the substrate support is at vacuum during processing and a second volume below the substrate support is at atmospheric pressure. The seals 178 and 188 provide a vacuum break. In other words, the seals 178 and 188 separate the vacuum of the first volume from the atmospheric pressure of the second volume.

A lower surface of the upper edge ring 150 rests on an upper surface of the edge ring support 160. In some examples, the upper edge ring 150 is not glued or otherwise bonded to the edge ring support 160. Furthermore, there are no seals (such as O-ring seals) arranged between the upper edge ring 150 and the edge ring support 160. The edge ring support 160 is bonded to the baseplate 116. In some embodiments, the edge ring support 160 may not be bonded to the baseplate 116.

Figure 2A:
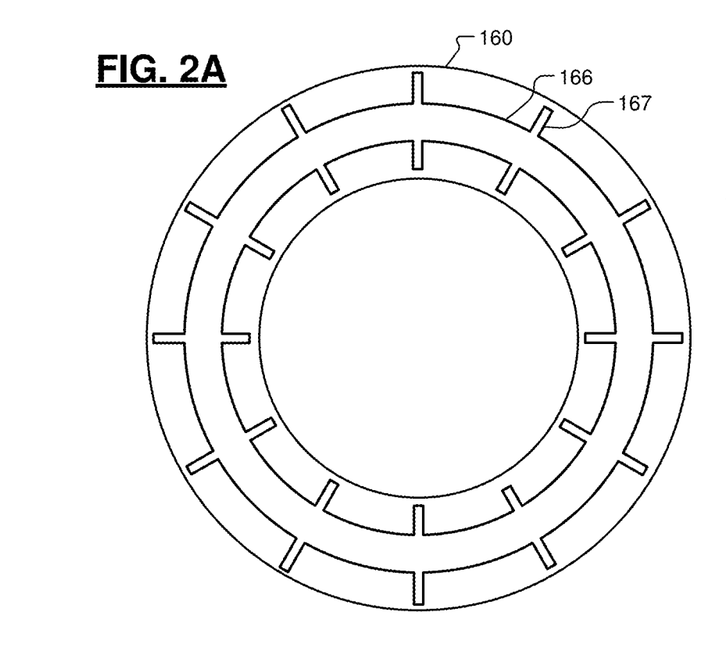
FIG. 2A is a top plan view of a gas channel located on an upper surface of an edge ring support.

Referring now to FIG. 2A, the cavity 166 is shown in further detail on an upper surface of the edge ring support 160. For example, the cavity 166 defines an annular channel. In some examples, the cavity 166 may further include radial arms 167 that extend inwardly and outwardly from the cavity 166 to increase a heat exchange surface area. In other examples, the radial arms are omitted. The lower surface of the upper edge ring 150 can be flat or may include a cavity as will described below. While a specific shape is shown, the cavity 166 and/or the radial arms 167 may have other shapes. For example, the cavity 166 may not include the radial arms 167, may have same or different lengths or spacing, the radial arms 167 may be curved, etc. In other examples, the cavity 166 may be serpentine, two or more of the cavities 166 may be arranged in the edge ring support 160, etc.

Figure 2B:
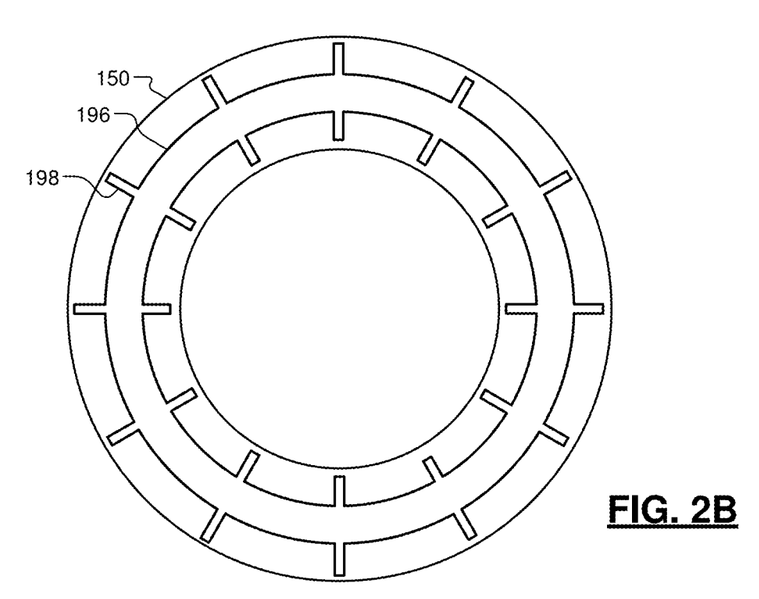
FIG. 2B is a top plan view of a gas channel located on a lower surface of an edge ring support.

While the cavity 166 is shown on an upper surface of the edge ring support 160, a cavity 196 can be located on a lower surface of the upper edge ring 150 in addition to or instead of the cavity 166 on the edge ring support 160. Referring now to FIG. 2B, the cavity 196 is located on the lower surface of the upper edge ring 150 and defines an annular channel or groove. In some examples, the upper surface of the edge ring support 160 can be flat or can include the cavity 166. In some examples, the cavity 196 may further include radial arms 198 that extend inwardly and outwardly therefrom to increase a heat exchange surface area. While a specific shape is shown, the cavity 196 and/or the radial arms 198 may have other shapes. In some examples, the cavity can be formed on both the lower surface of the upper edge ring 150 and the upper surface of edge ring support 160. In other examples, the cavities and radial arms can be clocked or rotated relative to one another or can have different shapes.

While a specific shape is shown, the cavity 196 and/or the radial arms 198 may have other shapes. For example, the cavity 196 may not include the radial arms 198, may have same or different lengths or spacing, the radial arms 198 may be curved, etc. In other examples, the cavity 196 may be serpentine, two or more of the cavities 196 may be arranged in the edge ring support upper edge ring 150, etc.

When the upper edge ring 150 is worn due to exposure to plasma, it is removed and replaced. Replacement can be made after a predetermined number of substrates are processed, after a predetermined period of exposure to plasma, and/or using other criteria. In some examples, sensors may be used to monitor edge ring wear and the upper edge ring 150 is replaced when a predetermined amount of wear is detected.

During processing, power is supplied to the electrostatic clamping electrode 162 to clamp the upper edge ring 150 against the edge ring support 160. In some examples, plasma may be struck in the processing chamber. Thermally-conductive gas is supplied to the cavity 166 to transfer heat from the upper edge ring 150 to the body 161 during plasma processing. Example thermally-conductive gases that may be used include, but are not limited to, helium, nitrogen, and argon.

As can be appreciated, the upper edge ring 150 is held in position on the edge ring support 160 by electrostatic clamping force. In some examples, the edge ring support 160 is bonded to a shoulder of the baseplate 116. In some examples, the electrostatic clamping electrodes 162 of the edge ring support 160 are high voltage (HV) poles for bipolar/monopolar electrostatic clamping. In some examples, the upper edge ring 150 uses gas and channels to provide uniform distribution of gas under the upper edge ring 150, to aid in removing heat from the upper edge ring 150.

For example, a process may require the upper edge ring 150 to be hotter than the upper layer 112 by a predetermined temperature range. For example, the predetermined temperature range may be 100° C.+/−10° C. Supplying and adjusting a flow rate of a thermally-conductive gas into the cavity 166 between the upper edge ring 150 and edge ring support 160 allows the temperature to be controlled within the predetermined temperature range.

Figure 3:
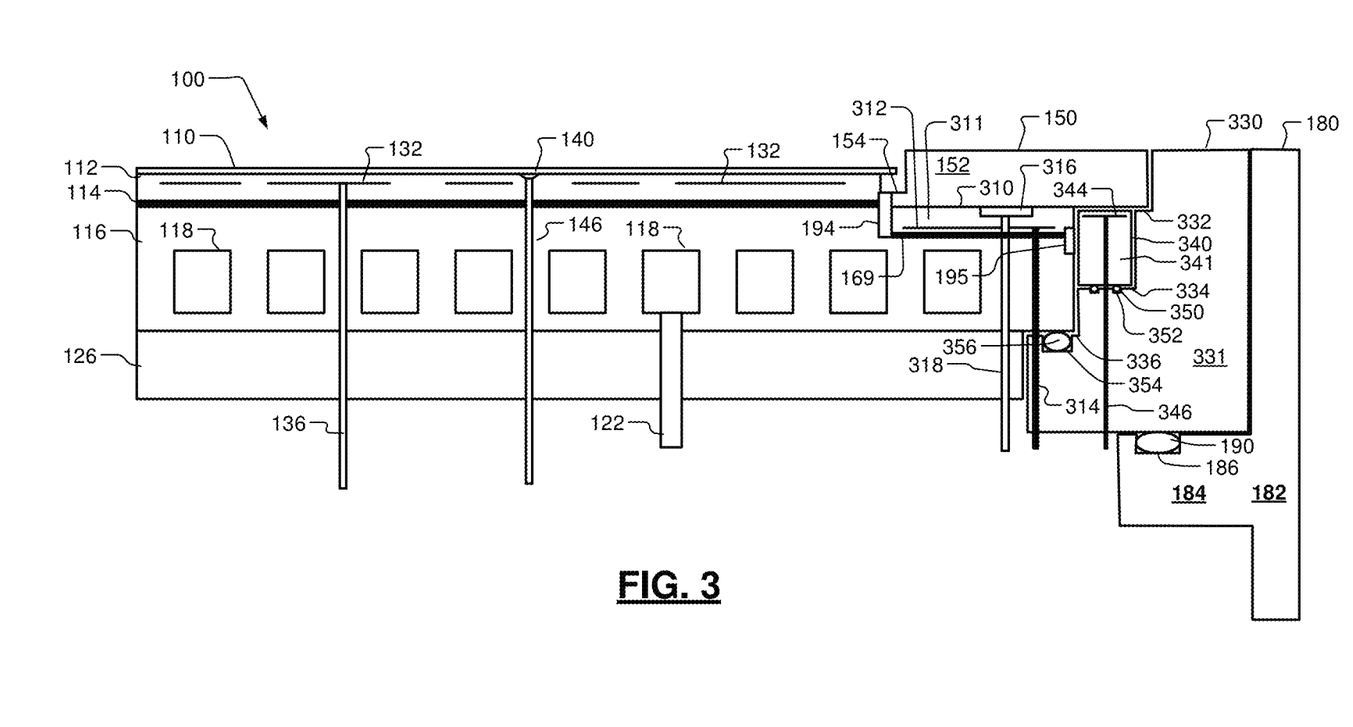
FIGS. 3-9 are cross-sectional side views of other examples of substrate supports with edge ring assemblies according to the present disclosure.

Referring now to FIG. 3, another example of the substrate support 100 includes an annular ring with an RF electrode to further control process performance using variable RF power to the RF electrode. An electrostatic ring support 310 includes a body 311 and an electrostatic clamping electrode 312 arranged in the body 311. The electrostatic ring support 310 extends inwardly approximately the same radial distance as the upper edge ring 150. The electrostatic ring support 310 extends outwardly only partially below the upper edge ring 150.

A clamping supply conductor 314 supplies power to the electrostatic clamping electrode 312 when electrostatic clamping of the upper edge ring 150 is desired. In some examples, a cavity 316 is formed on the upper surface of the electrostatic ring support 310 (or a lower surface of the edge ring 150). A gas supply line 318 supplies thermally-conductive gas to the annular cavity 316 during processing to transfer heat from the upper edge ring 150 into the electrostatic ring support 310.

A first outer edge ring 330 is arranged radially outside of baseplate 116, the upper edge ring 150 and the electrostatic ring support 310. The first outer edge ring 330 includes a body 331 and first, second and third annular steps 332, 334 and 336 projecting radially inwardly from the body 331. The first annular step 332 is at least partially arranged below a radially outer edge of the upper edge ring 150. The second annular step 334 is arranged at least partially below the annular ring 340 and the upper edge ring 150.

An annular ring 340 is arranged below a radially outer surface of the upper edge ring 150 between the first outer edge ring 330 and the baseplate 116 and/or the upper edge ring 150. The annular ring 340 includes a body 341 and an RF electrode 344. A supply conductor 346 supplies RF power to the RF electrode 344.

An upper surface of the second annular step 334 includes annular grooves 350. Seals 352 such as O-rings are arranged in the annular grooves 350 to provide a seal between the annular ring 340 and the upper surface of the second annular step 334 (around the clamping supply conductor 346). The third annular step 336 includes an annular groove 354 arranged on an upper surface thereof and a seal 356 such as an O-ring arranged in the annular groove 354.

Figure 4:
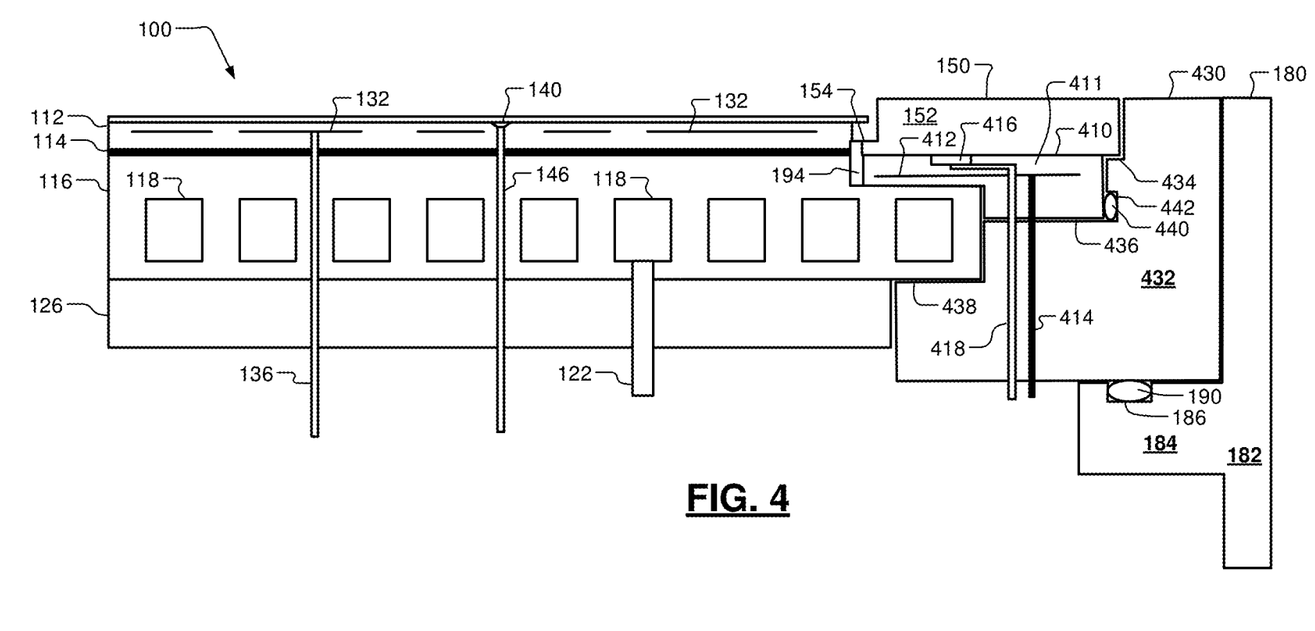
Figure 5:
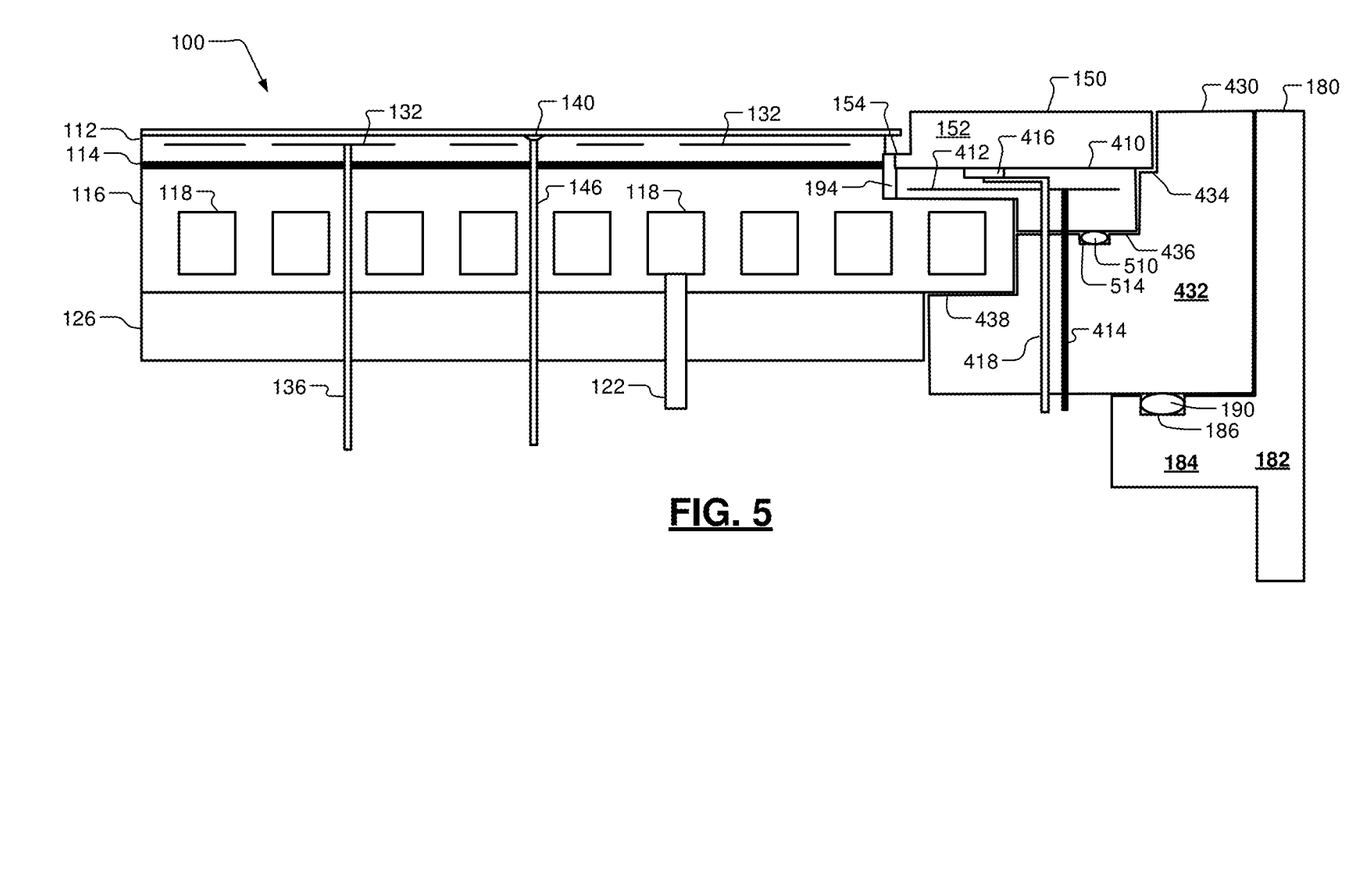
Figure 6:
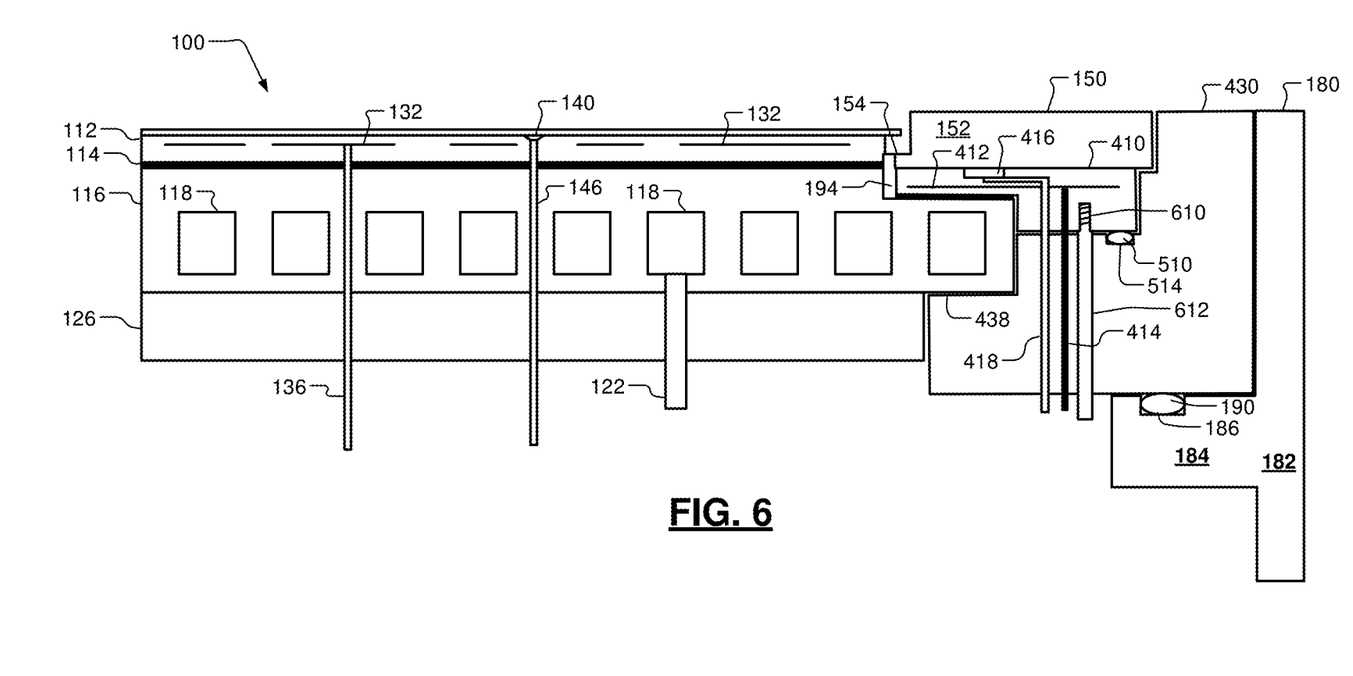

Referring now to FIGS. 4 to 6, other edge ring assemblies are shown. Power lines, gas lines and/or seals can be arranged in other locations and/or mechanical clamping can be used. In FIG. 4, gas supply lines and clamping supply conductors do not pass through the baseplate 116. An electrostatic ring support 410 includes a body 411 and an electrostatic clamping electrode 412. A clamping supply conductor 414 supplies voltage to the electrostatic clamping electrode 412 when electrostatic clamping of the upper edge ring 150 is desired. In some examples, a cavity 416 has an annular shape and is formed on the upper surface of the electrostatic ring support 410. A gas supply line 418 supplies thermally-conductive gas to the cavity 416 during processing to aid in transferring heat from the upper edge ring 150 into the electrostatic ring support 410.

A first outer edge ring 430 is arranged radially outside of the baseplate 116, the upper edge ring 150 and the electrostatic ring support 410. The first outer edge ring 430 includes a body 432 and first, second and third annular steps 434, 436 and 438, respectively, projecting radially inwardly from the body 432. The first annular step 434 is at least partially arranged below a radially outer edge of the upper edge ring 150. The second annular step 436 is arranged at least partially below the electrostatic ring support 410 and the upper edge ring 150. The third annular step 438 is arranged at least partially below the baseplate 116. The clamping supply conductor 414 and the gas supply line 418 pass through the first outer edge ring 430 but not the baseplate 116.

An inner side surface of the first outer edge ring 430 between the first and second annular steps 434 and 436, respectively, includes a groove 440 and a seal 442 such as an O-ring arranged in the groove 440. As can be appreciated, the seal 442 may be arranged in other locations. For example, in FIG. 5, an upper surface of the second annular step 436 includes a groove 510 and an O-ring seal 514 arranged in the groove 510.

In FIG. 6, mechanical clamping is used to hold the electrostatic ring support 410 to an underlying component such as an outer edge ring 430. The electrostatic ring support 410 includes a threaded cavity 610 to receive a threaded rod 612 to a motor or other device (not shown) to provide downward mechanical force when needed. In some examples, the rod 612 is made of plastic or another non-metallic material.

Figure 7:
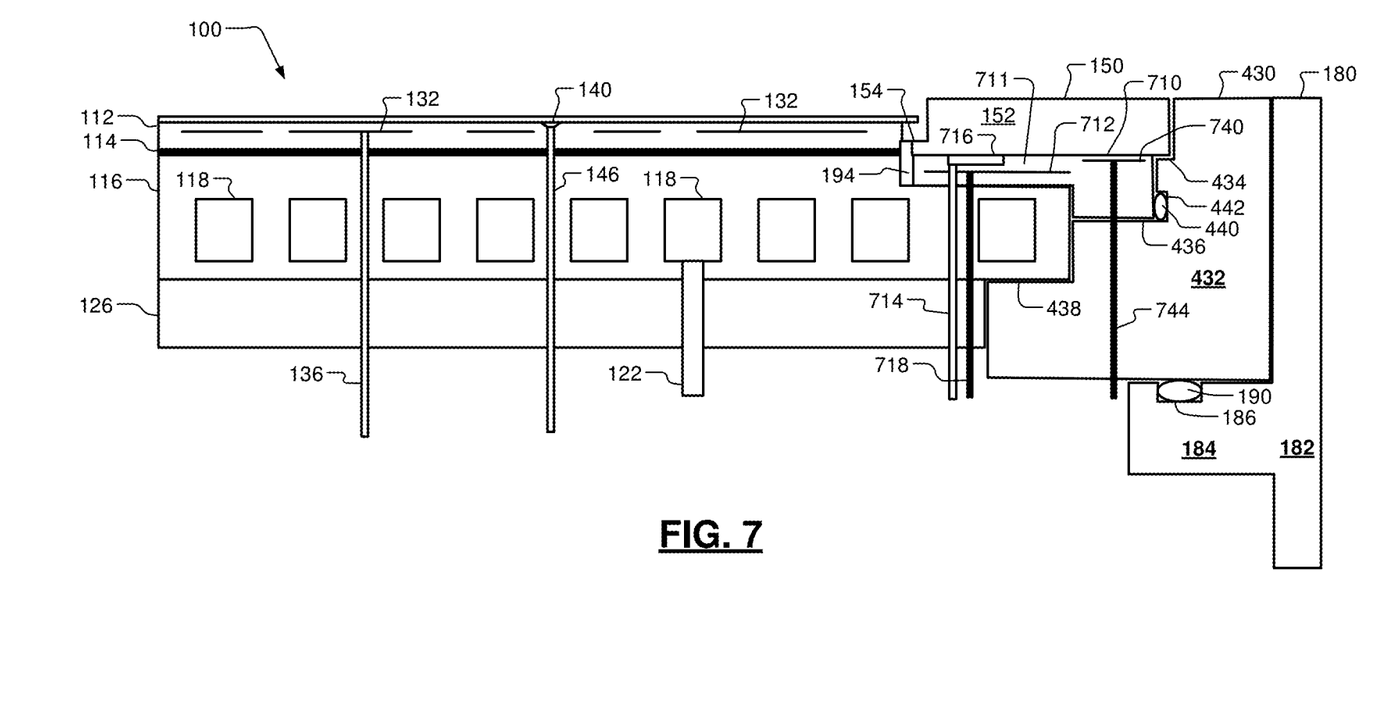
Figure 8:
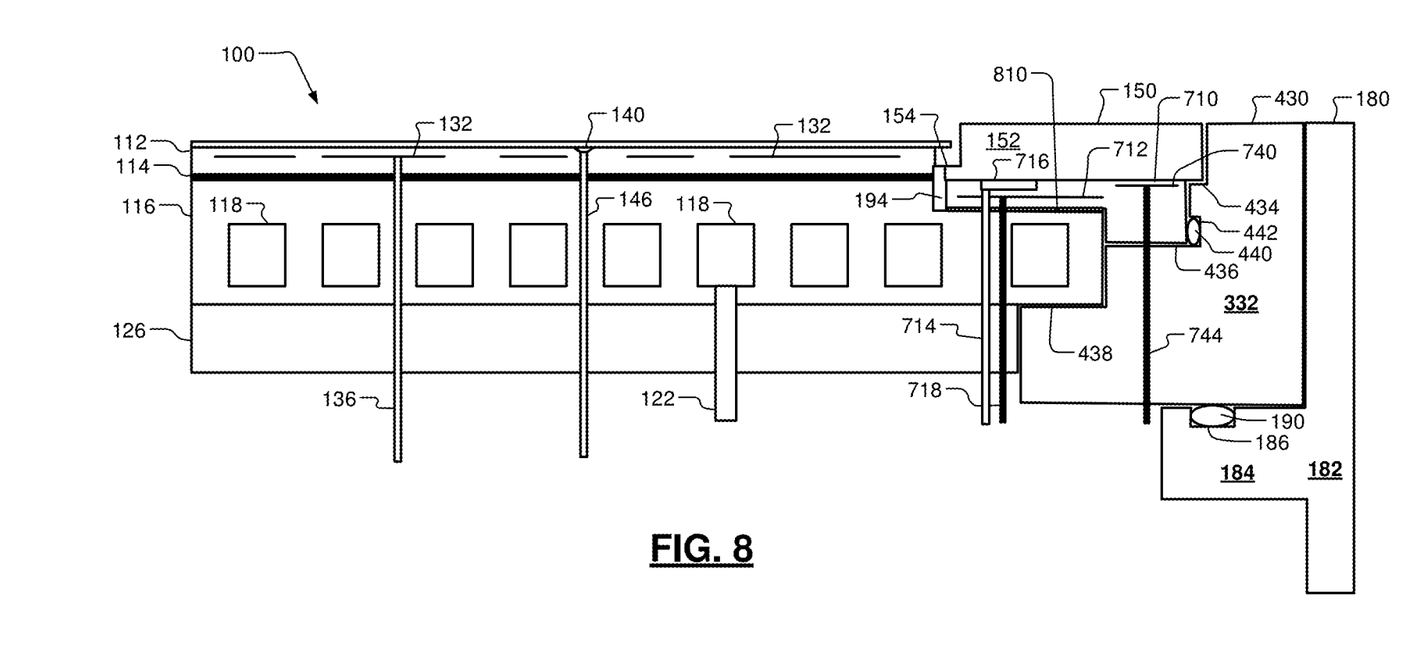
Figure 9:
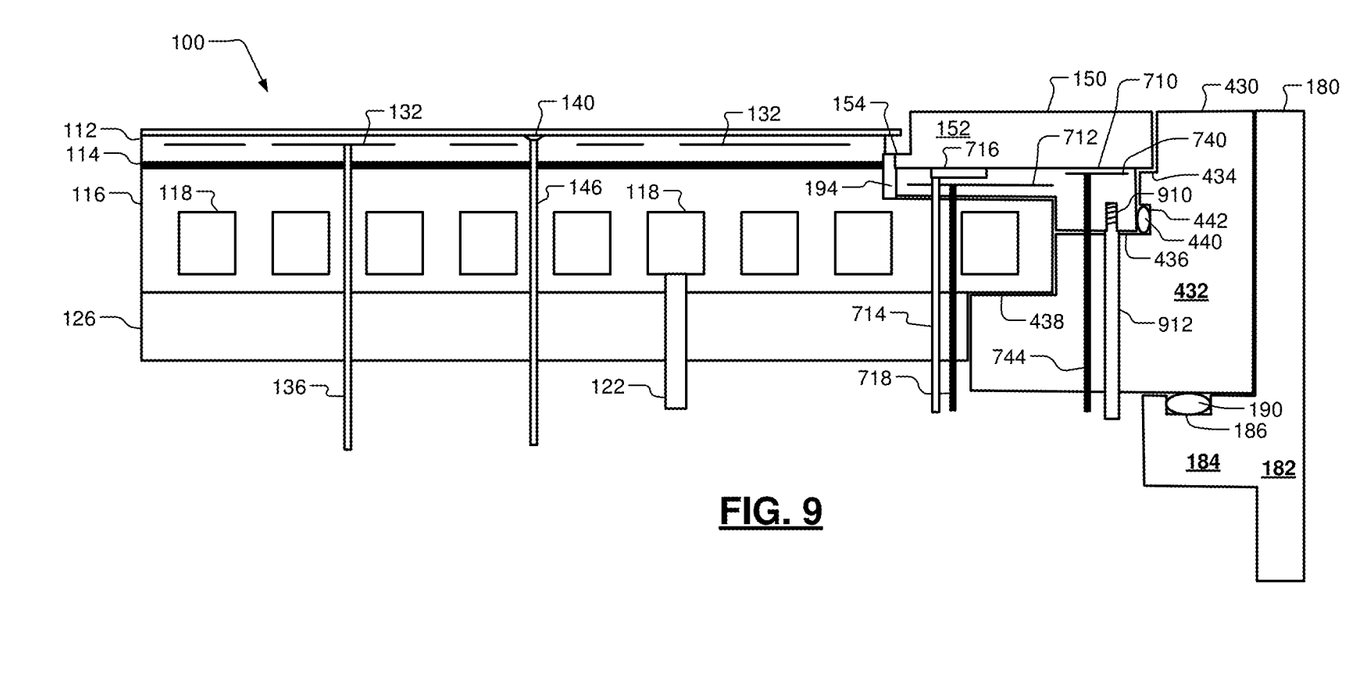

Referring now to FIGS. 7 to 9, other edge ring assemblies are shown. In FIG. 7, an electrostatic ring support 710 includes an electrostatic clamping electrode 712 and an RF electrode 740. A clamping supply conductor 718 supplies power to the electrostatic clamping electrode 712 when electrostatic clamping of the upper edge ring 150 is desired. In some examples, a cavity 716 is formed on the upper surface of the electrostatic ring support 710 and/or a lower surface of the edge ring 150. A gas supply line 714 supplies thermally-conductive gas to the cavity 716 during processing to aid in transferring heat from the upper edge ring 150 into the electrostatic ring support 710. The electrostatic ring support 710 further includes an RF electrode 740 and an RF supply conductor 744 supplying power to the RF electrode 740.

In this example, the gas supply line 714 and the clamping supply conductor 718 pass through the baseplate 116 and the RF supply conductor 744 passes through the outer edge ring 430. However, the gas supply line 714, the clamping supply conductor 718 and the RF supply conductor 744 can pass through either the baseplate 116 or the outer edge ring 430.

In FIG. 8, a thermal interface material (TIM) 810 is located between the electrostatic ring support 710 and the baseplate 116 to provide heat transfer. In this embodiment, the electrostatic ring support 710 may not be bonded to the baseplate 116. In other words, the TIM 810 does not provide adhesion or bonding and therefore an additional mechanism is required (e.g., a bonding layer, electrostatic clamping as described above, mechanical clamping, etc.) The TIM 810 may be optionally provided in any of the examples described in FIGS. 1-7.

In FIG. 9, mechanical clamping is used to mechanically clamp the electrostatic ring support 710. The electrostatic ring support 710 further includes a threaded cavity 910 to receive a threaded rod 912 connected to a motor or other device to provide downward mechanical force when needed. In some examples, the rod 912 is made of plastic or another non-metallic material. The TIM 810 of FIG. 8 may be optionally provided in the example described in FIG. 9.

In any of the examples shown in FIGS. 3-9, the cavity 196 described in FIGS. 1A and 1B may be provided in the top edge ring 150 instead of or in addition to the cavity in the corresponding edge ring support, electrostatic ring support, etc.

Using electrostatically clamped edge rings eliminates lengthy TIM application/removal processes during every ESC wet clean (e.g., which may be performed once every one to three months, depending on process), which will increase customer satisfaction and reduce production cost. Supplying thermally-conductive gas into the cavity between the edge ring and the edge ring support allows control of edge ring temperature by changing delivery pressure. Different grooves/patterns/depths/widths in the edge ring allow flexibility to change the thermal control of the edge ring temperature as described above in more detail. For example, while the The high voltage connections and/or gas supply lines can pass through the outer edge ring instead of the baseplate which makes manufacturing of the substrate support less expensive and allows additional flexibility. In addition, RF coupling between the high voltage connections and the baseplate is reduced, which simplifies RF filtering in DC circuits. In addition, arcing/lightup probability around the high voltage connections and gas supply lines is reduced.

For implementations with electrostatic and RF electrodes, the overall design and assembly is simplified. RF impedance/coupling control between the RF electrodes and the edge ring is more accurate and repeatable relative to other approaches. In addition, vacuum breaks can be created under the edge ring assembly, which improves resistance to terminal area arcing/light-up.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. An edge ring system comprising:
   a substrate support configured to support a substrate during plasma processing and including a baseplate and an upper layer arranged on the baseplate;
   an electrostatic ring support including a body and an electrostatic clamping electrode arranged in the body, wherein the electrostatic ring support is arranged above the baseplate and radially outside of the substrate during processing;
   an upper edge ring including an annular body configured to be arranged on and electrostatically clamped to the electrostatic ring support during plasma processing; and
   an annular ring arranged below the upper edge ring and radially outside of the electrostatic ring support,
      wherein the annular ring includes an annular ring body and an electrode arranged in the annular ring body, and
      wherein the upper edge ring is at least partially arranged on top of the electrostatic ring support.

2. The edge ring system of claim 1, further comprising:
   a supply conductor configured to supply power to the electrostatic clamping electrode; and
   a gas supply line configured to supply gas between the upper edge ring and the electrostatic ring support.

3. The edge ring system of claim 2, wherein the supply conductor and the gas supply line pass through the baseplate.

4. The edge ring system of claim 2, further comprising:
   a first outer edge ring arranged radially outside of the upper edge ring and the electrostatic ring support;
   a supply conductor configured to supply power to the electrostatic clamping electrode; and
   a gas supply line configured to supply gas between the upper edge ring and the electrostatic ring support,
      wherein at least one of the supply conductor and the gas supply line passes through the first outer edge ring.

5. The edge ring system of claim 4, wherein the supply conductor and the gas supply line pass through the first outer edge ring and not through the baseplate.

6. The edge ring system of claim 1, further comprising a gas supply line to supply a gas to a cavity defined by at least one of the electrostatic ring support and the upper edge ring between the electrostatic ring support and the upper edge ring.

7. The edge ring system of claim 6, wherein the annular body of the electrostatic ring support further includes the cavity on an upper surface of the electrostatic ring support facing the upper edge ring.

8. The edge ring system of claim 6, wherein the annular body of the upper edge ring further includes the cavity on a lower surface of the upper edge ring facing the electrostatic ring support.

9. The edge ring system of claim 6, wherein the gas supply line passes through a portion of the baseplate.

10. The edge ring system of claim 1, further comprising a first outer edge ring arranged radially outside of the upper edge ring and the electrostatic ring support.

11. The edge ring system of claim 10, further comprising a first seal arranged between an inner surface of the first outer edge ring and an outer surface of the baseplate.

12. The edge ring system of claim 10, further comprising a second outer edge ring arranged radially outside of the first outer edge ring.

13. The edge ring system of claim 12, further comprising a second seal arranged between an inner surface of the second outer edge ring and an outer surface of the first outer edge ring.

14. The edge ring system of claim 1, wherein the electrostatic ring support is bonded to an upper surface of the baseplate.

15. The edge ring system of claim 1, further comprising thermal interface material arranged between the electrostatic ring support and an upper surface of the baseplate.

16. The edge ring system of claim 1, wherein the upper edge ring is not bonded to the electrostatic ring support.

17. The edge ring system of claim 1, wherein the annular body of the upper edge ring includes a projection on a lower and radially inner surface thereof, and wherein the projection extends radially inside of a radially outer surface of the substrate.

18. The edge ring system of claim 1, further comprising:
a first outer edge ring arranged radially outside of the upper edge ring and the electrostatic ring support; and
a first seal arranged between an inner surface of the first outer edge ring and the baseplate radially inside of the annular ring.

19. The edge ring system of claim 18, wherein the annular ring is arranged radially inside of the first outer edge ring.

20. The edge ring system of claim 19, further comprising a seal arranged between annular ring and the first outer edge ring.

21. The edge ring system of claim 1, further comprising:
a first outer edge ring arranged radially outside of the upper edge ring and the electrostatic ring support;
a threaded cavity located in the electrostatic ring support; and
a rod received in the threaded cavity configured to mechanically clamp the electrostatic ring support to the first outer edge ring.

22. The edge ring system of claim 1, further comprising an electrode arranged in the electrostatic ring support.

23. The edge ring system of claim 22, further comprising:
a first supply conductor configured to supply power to the electrostatic clamping electrode;
a gas supply line configured to supply gas between the upper edge ring and the electrostatic ring support; and
a second supply conductor configured to supply power to the electrode.

24. The edge ring system of claim 23, further comprising:
a first outer edge ring arranged radially outside of the upper edge ring and the electrostatic ring support,
wherein the first supply conductor and the gas supply line pass through the baseplate and the second supply conductor passes through the first outer edge ring.

25. The edge ring system of claim 22, further comprising:
a first outer edge ring arranged radially outside of the upper edge ring and the electrostatic ring support;
a threaded cavity located in the edge electrostatic ring support; and
a rod received in the threaded cavity configured to mechanically clamp the electrostatic ring support to the first outer edge ring.

* * * * *